United States Patent [19]

Bauer et al.

[11] 4,277,886
[45] Jul. 14, 1981

[54] METHOD FOR MANUFACTURING AN ENCAPSULATED PROBE ON SHEATHED THERMOCOUPLES

[75] Inventors: Heinrich F. Bauer, Eichenau; Ernst Feitzelmayer, Munich, both of Fed. Rep. of Germany

[73] Assignee: Motoren-und Turbinen-Union München GmbH, Fed. Rep. of Germany

[21] Appl. No.: 89,894

[22] Filed: Oct. 31, 1979

[30] Foreign Application Priority Data

Oct. 31, 1978 [DE] Fed. Rep. of Germany ....... 2847296

[51] Int. Cl.³ ............................................ H01R 43/02
[52] U.S. Cl. ...................................... 29/860; 29/573; 29/863; 136/233; 136/234; 174/74 R; 228/136
[58] Field of Search ............................. 136/233, 234; 29/861–863, 867, 871, 573, 860; 174/74 R; 339/223 R, 223 S, 276 C, 276 A, 276 R, 276 T; 228/135, 136

[56] References Cited

U.S. PATENT DOCUMENTS

| | | | |
|---|---|---|---|
| 2,382,292 | 8/1945 | Carlson | 339/276 T X |
| 2,968,788 | 1/1961 | Neaderland | 339/276 T X |
| 3,284,247 | 11/1966 | McCall | 136/233 |
| 3,553,827 | 1/1971 | Baker et al. | 29/872 X |
| 3,556,864 | 1/1971 | Wagner | 29/573 X |
| 3,774,297 | 11/1973 | Wagner | 29/573 |

*Primary Examiner*—Nicholas P. Godici
*Assistant Examiner*—C. J. Arbes
*Attorney, Agent, or Firm*—Scully, Scott, Murphy & Presser

[57] ABSTRACT

A method for manufacturing an encapsulated probe or measuring head on sheathed thermocouples, in which thermocouple wires are imbedded in an outer metal sheath with the interposition of an insulating material, and wherein a thermal bead is produced by either an electric or autogeneous process at the sections of the thermocouple wires projecting from the metal sheath at the measuring head end of the wire.

11 Claims, 8 Drawing Figures

METHOD FOR MANUFACTURING AN ENCAPSULATED PROBE ON SHEATHED THERMOCOUPLES

BACKGROUND OF THE INVENTION

1. Field of the Invention

The present invention relates to a method for manufacturing an encapsulated probe or measuring head on sheathed thermocouples, in which thermocouple wires are embedded in an outer metal sheath with the interposition of an insulating material, and wherein a thermal bead is produced by either an electric or autogeneous process at the sections of the thermocouple wires projecting from the metal sheath at the measuring head end of the wire.

2. Discussion of the Prior Art

Known in the present state of the art are sheathed thermocouples with open and closed probe or measuring heads. In the first mentioned construction, the metal sheath reaches to a point shortly ahead of the measuring location, however, the thermocouple bead is freely welded, soldered, cemented or adhered to the support therefor. The sealing of the hygroscopic insulator is effected through adhesive materials based on epoxide polyamide or silicon resin. When the permissible boundary temperatures (mostly between 300° C. and 350° C.) are exceeded, this protection is eliminated. The result will be erroneous readings up to the complete failure of the signal pickup. Furthermore, there is no protection or only limited degree of protection against aggressive media. This protection is afforded only to thermocouples in which the tip is welded and the thermal bead form an integral part of the measuring probe. However, they also possess, in their construction with an oval cross-section, only a linear zone of contact with the substratum. Hereby, the bead is separated from the actual test location by half the diameter of the tube or by the minor semi-axis of the ellipse. At measurements with large temperature gradients in the boundary layer near the wall or at high flow velocities there will appear at the sheath of the thermocouple itself errors in the output signals. In addition to the foregoing, these commonly marketed sheathed thermocouples can be joined directly with the substratum through spot welding only with considerable difficulties and serious risks to the measuring probe element.

SUMMARY OF THE INVENTION

Accordingly, it is a primary object of the present invention to avoid the disadvantages encountered in the prior art and to provide a novel method for more simply and economically manufacturing sheathed thermocouple probes or measuring heads, particularly for surface and wall measurements while concurrently providing improved properties with regard to fastening, heat transfer and rapidity in response.

It is a more specific object of the present invention to provide a method for producing a thermocouple measuring head of the type described, wherein the method contemplates:

(a) positioning a thin-walled sleeve of a material similar to that of the metal sheath for about one-half over the bead and one-half over the metal sheath;

(b) pressing said sleeve onto the bead and the metal sheath so as to form an omega-shaped sleeve section and with the contour of the bead remaining to be at least visually apparent in the outer contour of the sleeve;

(c) squeezing the sleeve end remote from the metal sheath and projecting beyond the bead together around the contour of the bead into a generally duck's foot configuration;

(d) weld sealing the remaining frontal gap at the pinched sleeve end;

(e) welding or soldering the sleeve to the sheath at its face immediately adjacent the metal sheath to form a tight seal wherein the solder, such as a silver or high-temperature nickel solder, is selected in conformance with the particular operating temperature of the thermocouple.

Through enlargement of the contact area and possible adaptation to the form of the substratum, the present invention provides a desirable relationship between the surface area facing away from the test location and the area in contact with the test location. This renders it possible to achieve values down to almost the theoretical value of 1.0. The resultant good of heat transfer conditions, inasmuch as the thermocouple bead itself is shifted out of the line of symmetry and thus moved closer to the contact area, in addition to an improved measuring accuracy, have the result of a significant reduction in the response time. Moreover the measuring probes can be joined directly to the substratum, preferably through microspot welding, without endangering the thermocouple bead. They can be made in any desirable size from stock material found in any suitably equipped laboratory and, accepting certain limitations, even under open area or field conditions.

BRIEF DESCRIPTION OF THE DRAWINGS

Reference may now be had to preferred embodiments of the invention, taken in conjunction with the accompanying drawings; in which.

DETAILED DESCRIPTION

Figure 1:
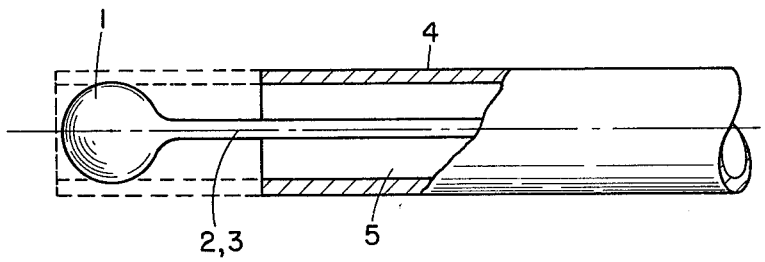
FIG. 1 illustrates a partly longitudinally sectioned head end of a sheathed thermocouple wire with a non-encapsulated bead.
Figure 2:
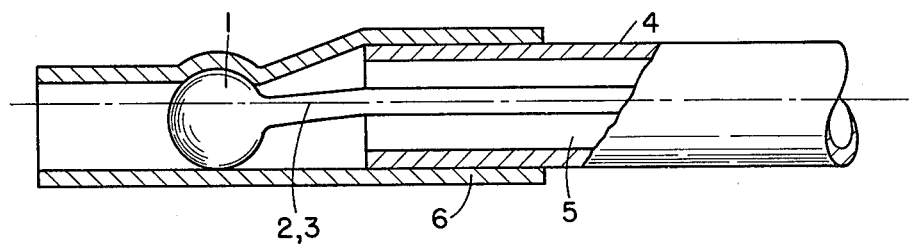
FIG. 2 illustrates the end of sheathed thermocouple wire of FIG. 1 with a sleeve pressed or partially deformed in position over the end of the sheath and over the thermal bead.

Referring now to FIGS. 1 through 8 of the drawings, the probe or measuring head end of the sheathed thermocouple of the present invention consists of the following basic elements namely, a thermal bead 1, the thermocouple wires 2, 3, a metal sheath 4, an insulator material 5, and a relatively thin-walled sleeve 6, preferably formed of the same or a similar material as the metal sheath 4.

In order to produce the configuration illustrated in FIG. 1, from a sheathed thermocouple wire of suitable material and diameter there is cut off the length required. At the probe end, the length of sheath 4 including the insulation 5 at this end, which may here be an MgO filler, is stripped off as shown by the broken lines so that only the ends of the two wires 2, 3 project from the metal sheath 4 at the probe or measuring head end.

From the two axially projecting ends of the two wires 2, 3 there are then formed the thermal bead 1 in the intended size through conventional methods either electrically or autogeneously.

The thermal bead 1 can also be produced, for instance, by autogeneous welding of the two wires together with the addition of borax-containing flux and glass powder. Within the molten layer of glass, the weld material will be extensively protected from oxidation and reduction reactions. The surface tension of the glass skin also appreciably assists in the formation of a uniform and spherical shape of the thermal bead. After quenching, the remaining glass residues are mechanically removed. In order to manufacture the measuring head or probe, the sleeve 6 is initially slid for about one-half over the thermal bead and over the metal sheath 4; thereafter, the sleeve 6 (FIG. 2) is so pressed onto the thermal bead 1 and the metal sheath 4 by means of a pressing tool that the sleeve is imparted an omega-shaped cross-section (FIGS. 4 and 5) and the bead contour remains at least indicatively apparent in the outer contour of the sleeve; during a subsequently adjoining pressing operation, the end of the sleeve facing away from the metal sheath 4 and projecting beyond the bead 1 is compressed into a duck-footed shape which follows the contour of the bead, (FIGS. 3 and 6); thereafter, the remaining end gap 7 at the pressed together end of the sleeve is sealed by welding (weld seam 8, FIG. 3). The described shaping or pressing and squeezing operation on the sleeve 6 can be carried out by means of a pressing tool in the shape, for example, of a modified pair of crimping pliers.

Figure 7:
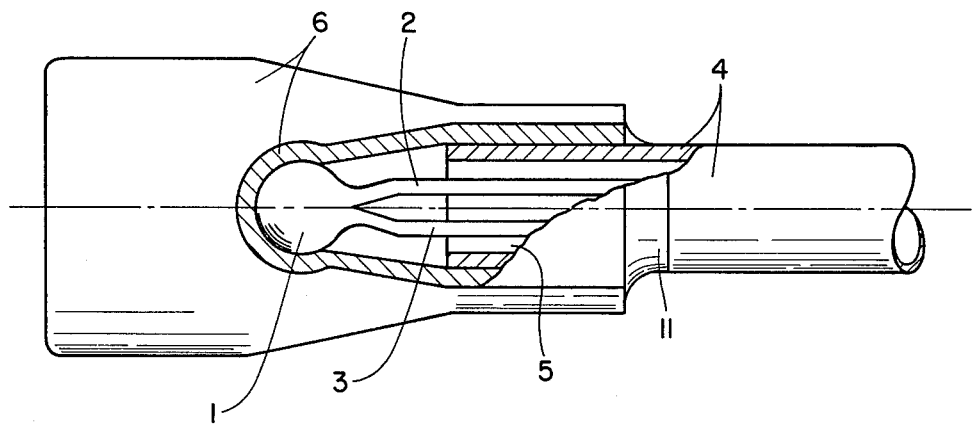
FIG. 7 is a plan view of the longitudinally partially sectioned and encapsulated sheathed thermocouple of FIG. 3, illustrating the soldered connection formed between the sleeve and the sheath during the manufacturing process.
Figure 8:
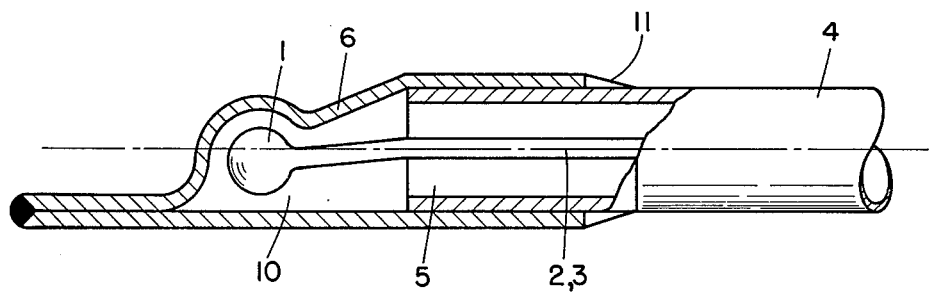
FIG. 8 is another embodiment of a longitudinally partially sectioned shown, encapsulated sheathed thermocouple, in which the thermal bead is insulated with respect to the sheath and the sleeve or the substrata.

As becomes apparent from FIGS. 7 and 8, the sleeve 6, after completion of its shaping (pressing and squeezing) process, can be sealingly soldered to the metal sheath 4 at its end surface directly adjacent to the sheath, using a silver solder or a high-temperature nickel solder, and namely after the prevailing operating temperature, or can be sealingly welded thereto to satisfy still more stringent requirements (soldering or weld locating 11).

Figure 3:
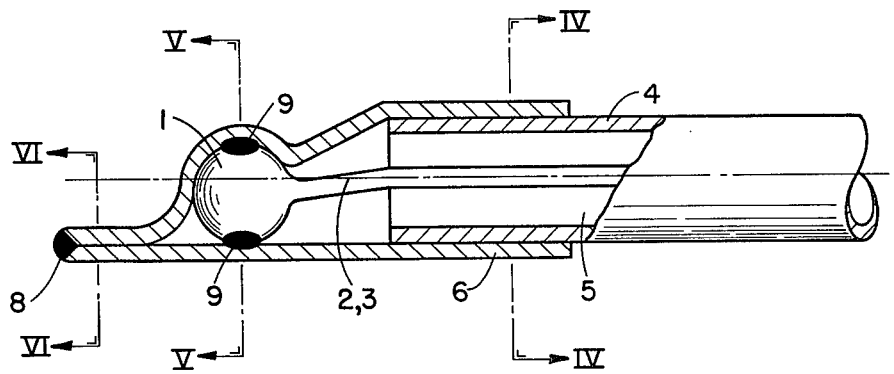
FIG. 3 illustrates the end of sheathed thermocouple wire pursuant to FIGS. 1 and 2 with a fully deformed sleeve unlike in FIG. 2, with welded connections between the thermal bead and the sleeve and at the flat pressed end of the sleeve.

Pursuant to FIG. 3, the thermal bead 1 can be finally and undisplaceably connected with the sleeve 6, for instance, through microspot welding (weld locations 9); it would be suitable in that case to only thereafter effect the duck-footed squeezing operation on the projecting sleeve end.

The measuring probe which is manufactured in accordance with the above process steps provides for a direct bonding between the thermal bead 1 and the metal sheath 4 or the substratum.

For the case in which it is desired to have unbonded thermocouples which have a somewhat slower response because of the necessary insulation between the bead and the sleeve or the substratum, the present invention provides for the bead 1 to be immersed, prior to the sleeve 6 being seated on the metal sheath 4 in an intermediate insulating compound 10 (FIG. 8), for instance a high-temperature strain gage cement, which is first allowed to set before the sleeve 6 is imparted the shape shown in FIG. 8, in essence, before it is completely deformed, by a concurrent pressing and squeezing operation.

Figure 4:
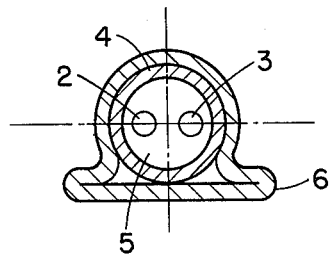
FIG. 4 is a sectional view taken along line IV—IV in FIG. 3.
Figure 5:
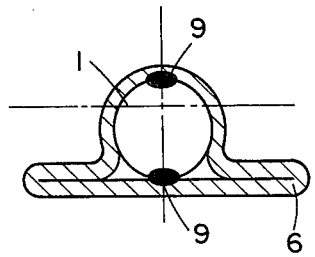
FIG. 5 is a sectional view taken along line V—V in FIG. 3.
Figure 6:
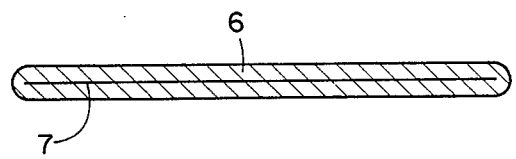
FIG. 6 is a sectional view taken along line VI—VI in FIG. 3.

In an alternative process for producing an unbonded thermocouple, the sleeve 6 is first pressed about the metal sheath 4, with the formation of an omega-shaped cross-section as in FIG. 4, after which the zone of sleeve 6 located in the region of the bead 1 is filled with the intermediate insulating compound 10, for instance, an MgO or $Al_2O_3$ powder insulating material, whereupon the powder material is compacted by agitating, spinning or similar procedures, and the sleeve section which is arranged essentially above the bead 1 is then pressed into the desired shape, where this pressing operation should be effected in conjunction with the operation in which the sleeve end projecting axially from the bead 1 is squeezed into the shape of a duck's foot. However, this is not an absolute requirement, contrastingly; the sleeve section near the bead 1 can first be shaped in conformance with the contour of the bead, only afterwards is there effected the duck's foot-like squeezing operation.

In a further aspect of the present invention, the sleeve 6 can be imparted an oval cross-section prior to being seated on the metal sheath, or it can be pressed stepwise onto the metal sheath so as to produce maximally uniform welding lugs to the left and to the right of the sleeve.

The present invention also contemplates variations in the size of the lateral welding lugs in that the sleeve before it is seated on the metal sheath is imparted different outer and/or inner diameters.

In order to further rationalize the manufacturing process, the mentioned soldering, brazing or welding operation (location 11) can be performed simultaneously with the welding of the end surfaced gap 7 at the compressed sleeve end.

In the interest of obtaining a still further economical manufacture, the welding operation at the end gap 7 of the compressed sleeve end (welding seam 8), as well as the soldering or welding operation (location 11) for producing the remaining sheath-to-sleeve connection can be initiated or employed directly during the shaping process of the sleeve.

The feasibility of the present invention can be demonstrated, for example, with a thermocouple sheath element of nickel or chromium-nickel having an austenitic steel sheath of 1 mm in diameter. The nickel tube which is to be pressed onto the steel sheath can hereby have a wall thickness of 0.1 mm as well as an internal diameter of 1.2 to 1.3 mm.

What is claimed is:
1. In a method for manufacturing an encapsulated probe on sheathed thermocouples including thermocouple wires embedded in an external metal sheath, an insulating material encasing said wires, and a bead is formed by electrically or autogeneously processing the extreme portions of the thermocouple wires projecting from the metal sheath, the improvement comprising:
(a) positioning a thin-walled sleeve of a material similar to that of the metal sheath for about one-half over the bead and one-half over the metal sheath;

(b) pressing said sleeve onto the bead and the metal sheath so as to form an omega-shaped sleeve section and with the contour of the bead remaining to be at least visually apparent in the outer contour of the sleeve;

(c) squeezing the sleeve end remote from the metal sheath and projecting beyond the bead together around the contour of the bead into a generally duck's foot configuration;

(d) weld sealing the remaining frontal gap at the pinched sleeve end;

(e) welding or soldering the sleeve to the sheath at its face immediately adjacent the metal sheath to form a tight seal wherein the solder is a silver or high-temperature nickel solder selected in conformance with the particular operating temperature of the thermocouple.

2. Method as claimed in claim 1, comprising fully shaping said sleeve in a single operation.

3. Method as claimed in claim 1, comprising welding said bead to the sleeve prior to the projecting sleeve end being squeezed together into the duck's foot configuration.

4. Method as claimed in claim 1, comprising welding said bead to the sleeve subsequent to the sleeve being pressed onto metal sheath while forming said omega-shaped cross-section.

5. Method as claimed in claim 1 or 2, comprising immersing said bead in an intermediate insulating compound, such as a high-temperature strain gage cement, and allowing said compound to set prior to effecting the concurrent pressing and squeezing on the sleeve.

6. Method as claimed in claim 1, comprising pressing the sleeve around the metal sheath; then filling the sleeve zone in the vicinity of the bead with an intermediate powder insulating material, such as MgO or $Al_2O_3$; and compacting said insulating powder material before the sleeve section located essentially above the bead is pressed into its final shape.

7. Method as claimed in claim 1, comprising imparting an oval cross-section to said sleeve before seating said sleeve on the metal sheath.

8. Method as claimed in claim 1, comprising imparting predetermined outer and inner diameters to said sleeve before seating the sleeve on the metal sheath.

9. Method as claimed in claim 1, comprising effecting said welding or soldering concurrently with the welding of the frontal gap at the pinched end of the sleeve.

10. Method as claimed in claim 1, comprising effecting the welding on the frontal gap of the pinched sleeve end and the welding or soldering operation in the location for forming the remaining sheath-to-sleeve connection being initiated during the shaping of the sleeve.

11. Method as claimed in claim 1, comprising pressing the sleeve onto the metal sheath in a stepped sequence.

* * * * *